(12) United States Patent
Tanaka

(10) Patent No.: US 10,786,991 B2
(45) Date of Patent: *Sep. 29, 2020

(54) LIQUID JETTING APPARATUS

(71) Applicant: BROTHER KOGYO KABUSHIKI KAISHA, Nagoya-shi, Aichi-ken (JP)

(72) Inventor: Taiki Tanaka, Yokkaichi (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/823,738

(22) Filed: Mar. 19, 2020

(65) Prior Publication Data

US 2020/0215820 A1 Jul. 9, 2020

Related U.S. Application Data

(63) Continuation of application No. 15/919,626, filed on Mar. 13, 2018, now Pat. No. 10,618,282.

(30) Foreign Application Priority Data

Sep. 29, 2017 (JP) .................................. 2017-192192

(51) Int. Cl.
*B41J 2/14* (2006.01)
*B41J 2/16* (2006.01)

(52) U.S. Cl.
CPC ........... *B41J 2/14233* (2013.01); *B41J 2/161* (2013.01); *B41J 2/1623* (2013.01); *B41J 2/1626* (2013.01);

(Continued)

(58) Field of Classification Search
CPC .......... B41J 2/14233; B41J 2002/14241; B41J 2002/14491; B41J 2/161; B41J 2/1623;

(Continued)

(56) References Cited

U.S. PATENT DOCUMENTS

| 10,618,282 B2* | 4/2020 | Tanaka .................. B41J 2/1623 |
| 2017/0282559 A1 | 10/2017 | Ito et al. |
| 2018/0022095 A1 | 1/2018 | Hirai et al. |

FOREIGN PATENT DOCUMENTS

| JP | 2008-284781 A | 11/2008 |
| JP | 2016-185600 A | 10/2016 |
| JP | 2016-185604 A | 10/2016 |

OTHER PUBLICATIONS

Non-Final Office Action issued in parent U.S. Appl. No. 15/919,626 dated Aug. 19, 2019.

(Continued)

*Primary Examiner* — Geoffrey S Mruk

(74) *Attorney, Agent, or Firm* — Merch & Gould P.C.

(57) ABSTRACT

A liquid jetting apparatus includes: a pressure chamber formation member having first pressure chambers arranged in a first direction, and an insulation film covering the first pressure chambers; a cover which is joined to the pressure chamber formation member and has a first convex portion and a second convex portion; and a wiring member joined to the pressure chamber formation member. Each of the first convex portion and the second convex portion has a bonding surface to the pressure chamber formation member and extends in the first direction.

11 Claims, 10 Drawing Sheets

(52) U.S. Cl.
CPC .... *B41J 2/1646* (2013.01); *B41J 2002/14241* (2013.01); *B41J 2002/14491* (2013.01)

(58) Field of Classification Search
CPC ... B41J 2/1646; B41J 2/1626; H01L 41/0973; H01L 41/0475
See application file for complete search history.

(56) References Cited

OTHER PUBLICATIONS

Notice of Allowance issued in parent U.S. Appl. No. 15/919,626 dated Dec. 4, 2019.
Restriction Requirement issued in parent U.S. Appl. No. 15/919,626 dated Mar. 19, 2019.

\* cited by examiner

LIQUID JETTING APPARATUS

CROSS REFERENCE TO RELATED APPLICATION

The present application is a continuation of U.S. patent application Ser. No. 15/919,626, filed Mar. 13, 2018, now U.S. Pat. No. 10,618,282, which claims priority from Japanese Patent Application No. 2017-192192, filed on Sep. 29, 2017, the disclosures of which are incorporated herein by reference in their entirety.

BACKGROUND

Field of the Invention

The present invention relates to a liquid jetting apparatus.

Description of the Related Art

Conventionally, there is known a liquid jetting apparatus which includes piezoelectric elements. A conventional liquid jetting apparatus includes individual electrodes provided to correspond individually to the piezoelectric elements, and a common electrode provided commonly for the piezoelectric elements. The common electrode is connected with a wiring member on which a driver IC is mounted to output a drive signal for driving the piezoelectric elements via traces connected to the common electrode. Further, each of the individual electrodes is connected with the wiring member via a trace connected thereto.

Because the common electrode is provided commonly for the piezoelectric elements, the electric current flowing through the traces connected to the common electrode is larger than the electric current flowing through the traces connected to the individual electrodes. Therefore, on the way of the route linking the contact points between the traces and the common electrode and the contact points between the traces and the wiring member, if a trace connected to the common electrode becomes thinner, then the electric resistance of that part will become larger. If the electric resistance of the trace for the common electrode becomes larger, then the waveform of the drive signal transmitted to each of the piezoelectric elements is liable to become dull and/or the common electrode is liable to underdo excessive heating.

Japanese Patent Application Laid-open No. 2016-185604 discloses an ink-jet head including piezoelectric elements each of which has an upper electrode and a lower electrode facing each other, and a piezoelectric body layer interposed between the upper electrode and the lower electrode. The upper electrode is the common electrode shared among the piezoelectric elements. A common electrode layer is provided as traces on the upper surface of the upper electrode. A sealing plate is provided as a cover on the respective piezoelectric elements, and a common bump electrode provided on the lower surface of the sealing plate is joined with the common electrode layer. Further, an individual electrode layer is laid as traces on the upper surface of the lower electrodes. The individual electrode layer extends from the position laid with the lower electrodes to the upper surface of the piezoelectric layer, passing over the step at the end portion of the piezoelectric body layer. The individual electrode layer is joined with individual bump electrodes provided on the lower surface of the sealing plate at the position of the upper surface of the piezoelectric body layer.

According to Japanese Patent Application Laid-open No. 2016-185604, the individual electrode layer is a film formed across the step in the vicinity of the end portion of the piezoelectric layer. Therefore, when forming the film of the individual electrode layer, the individual electrode layer is liable to become thinner than the desired thickness in the vicinity of the end portion of the piezoelectric layer. On the other hand, the common electrode layer extends from the position overlapping with the upper electrode to the position joined with the common bump electrode, without coming down the step of the piezoelectric layer. Therefore, the common electrode layer is less liable to become thinner on the route linking the position overlapping the upper electrode and the position joined with the common bump electrode. Hence, according to the ink-jet head of Japanese Patent Application Laid-open No. 2016-185604, such problems are less likely to happen as the drive signal becoming dull and/or the heating in the common electrode layer which is the traces for the common electrode.

SUMMARY

However, the sealing plate of Japanese Patent Application Laid-open No. 2016-185604 is used as a substrate to support a pressure chamber formation substrate, in a process of grinding the pressure chamber formation substrate to a desired thickness for forming pressure chambers. In this case, the pressure chamber formation substrate is ground with the common bump electrode and the individual bump electrodes being respectively joined with the common electrode layer and the individual electrode layer. On this occasion, there is a load on the junction part between the common bump electrode and the common electrode layer, and the junction part between the individual bump electrodes and the individual electrode layer. Therefore, in the vicinity of those junction parts, crack is liable to occur in the upper electrode and the piezoelectric body layer. Further, the junction parts are liable to separate due to the load thereon in the grinding process.

The present teaching is made in view of such situations, and an object thereof is to provide a liquid jetting apparatus which is capable of joining the wiring member and the traces from the upper electrode and lower electrodes, and which is less likely to give rise to defection in the manufacturing process.

According to a first aspect of the present teaching, there is provided a liquid jetting apparatus including: a pressure chamber formation member having first pressure chambers arranged in a first direction, and an insulation film covering the first pressure chambers; a cover joined to the pressure chamber formation member, the cover having a first convex portion and a second convex portion, each of the first convex portion and the second convex portion having a bonding surface to the pressure chamber formation member and extending in the first direction; and a wiring member joined to the pressure chamber formation member, wherein the first pressure chambers have first ends aligned in the first direction, second ends aligned in the first direction, and centers positioned between the first ends and the second ends in a second direction which is along a planar direction of the insulation film and orthogonal to the first direction; the centers of the respective first pressure chambers being positioned between the first convex portion and the second convex portion of the cover in relation to the second direction, the pressure chamber formation member has: first electrodes overlapping respectively with the first pressure chambers in a third direction orthogonal to the planar direction of the insulation film, while sandwiching the insulation film therebetween; a piezoelectric layer overlapping with the insulation film and the first electrodes in the third direction; a second electrode overlapping with the first electrodes in the third direction, while sandwiching the piezoelectric layer therebetween; first traces connected respectively with the first electrodes; and a second trace connected with the second electrode, the piezoelectric layer has a first surface facing the insulation film and the first electrodes, and a second surface on a side opposite to the insulation film and the first electrodes with respect to the first surface, the second trace is connected to the wiring member, the second trace includes an extending portion extending continuously from the second electrode to a contact point with the wiring member, and the piezoelectric layer is positioned between the insulation film and the extending portion of the second trace in relation to the third direction.

According to a second aspect of the present teaching, there is provided a liquid jetting apparatus including: a pressure chamber formation member having first pressure chambers arranged along a first direction, and an insulation film covering the first pressure chambers; and a wiring member joined to the pressure chamber formation member, wherein the pressure chamber formation member has: first electrodes overlapping respectively with the first pressure chambers in a third direction orthogonal to the planar direction of the insulation film, while sandwiching the insulation film therebetween; a piezoelectric layer overlapping with the insulation film and the first electrodes in the third direction; a second electrode overlapping with the first electrodes in the third direction while sandwiching the piezoelectric layer therebetween; first traces connected respectively with the first electrodes; and a second trace connected with the second electrode, the piezoelectric layer has a first surface facing the insulation film and the first electrodes, and a second surface on a side opposite to the insulation film and the first electrodes with respect to the first surface, the second trace is connected to the wiring member, the second trace includes an extending portion extending continuously from the second electrode to a contact point with the wiring member, the piezoelectric layer is positioned between the insulation film and the extending portion of the second trace in relation to the third direction, the wiring member has a base material and traces formed in the base material, and the base material of the wiring member has a first part joined to the pressure chamber formation member, a second part drawn out in a direction away from the pressure chamber formation member, and a curved part between the first part and the second part.

BRIEF DESCRIPTION OF THE DRAWINGS

FIGS. 2A to 2C depict a pressure chamber formation substrate, wherein FIG. 2A is a plan view depicting an end side of the pressure chamber formation substrate according to a conveyance direction, FIG. 2B is a cross-sectional view along the line IIB-IIB of FIG. 2A, and FIG. 2C is a cross-sectional view along the line IIC-IIC of FIG. 2A.

FIGS. 3A and 3B are enlarged views of an individual trace, wherein FIG. 3A is an enlarged perspective view of the part A of FIG. 2A, and FIG. 3B is an enlarged perspective view of the part B of FIG. 2A.

FIGS. 4A to 4C depict the pressure chamber formation substrate joined with a cover, wherein FIG. 4A is a plan view depicting the end side of the pressure chamber formation substrate joined with the cover according to the conveyance direction, FIG. 4B is a cross-sectional view along the line IVB-IVB of FIG. 4A, and FIG. 4C is a cross-sectional view along the line IVC-IVC of FIG. 4A.

FIGS. 7A and 7B depict the pressure chamber formation substrate and cover of a jetting module according to a first modified embodiment of the present teaching, wherein FIG. 7A is a plan view corresponding to FIG. 4A, and FIG. 7B is a cross-sectional view corresponding to FIG. 4B.

FIGS. 8A and 8B depict the pressure chamber formation substrate and cover of a jetting module according to a second modified embodiment of the present teaching, wherein FIG. 8A is a plan view corresponding to FIG. 4A, and FIG. 8B is a cross-sectional view corresponding to FIG. 4B.

FIGS. 9A and 9B depict the pressure chamber formation substrate and cover of a jetting module according to a third modified embodiment of the present teaching, wherein FIG. 9A is a cross-sectional view corresponding to FIG. 2B, and FIG. 9B is a cross-sectional view corresponding to FIG. 2C.

DESCRIPTION OF THE EMBODIMENT

Figure 1:
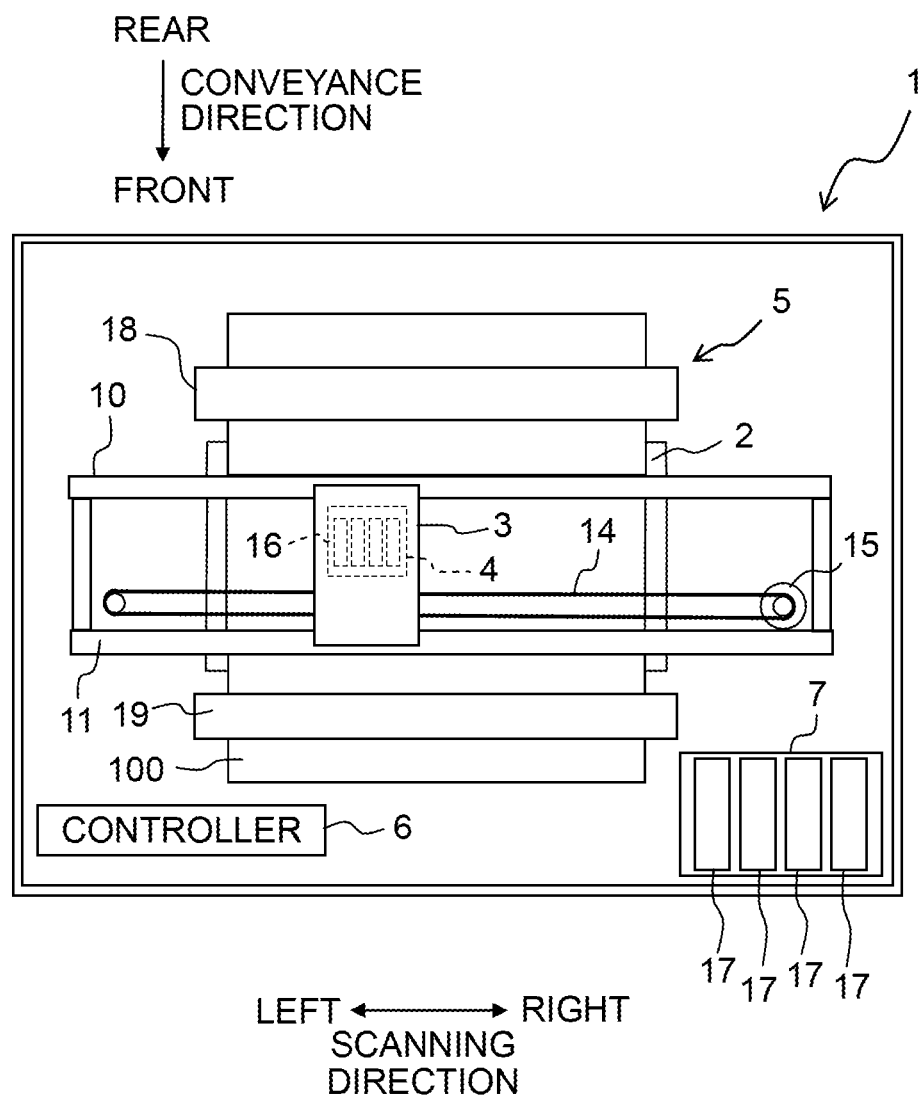
FIG. 1 is a schematic plan view of a printer according to an embodiment of the present teaching.

Next, a preferred embodiment of the present teaching will be explained. First, referring to FIG. 1, an explanation will be made about a schematic configuration of an ink-jet printer 1. Note that each direction of the front, rear, left and right depicted in FIG. 1 is defined as the "front", "rear", "left", and "right" of the printer. Further, the near side of the page is defined as the "upper" whereas the far side of the page is defined as the "lower". Hereinbelow, each term of the above front, rear, left, right, upper and lower directions will be used as appropriate for the explanation.

<Schematic Configuration of the Printer>

As depicted in FIG. 1, the ink-jet printer 1 includes a platen 2, a carriage 3, an ink-jet head 4, a conveyance mechanism 5, a controller 6, and the like.

A recording medium, namely recording paper 100, is placed on the upper surface of the platen 2. The carriage 3 is configured to be reciprocatingly movable in a left/right direction (to be referred to below as a scanning direction) along two guide rails 10 and 11, in an area facing the platen 2. An endless belt 14 is linked to the carriage 3. A carriage drive motor 15 drives the endless belt 14 such that the carriage 3 may move in the scanning direction.

The ink-jet head 4 is fitted on the carriage 3 to move together with the carriage 3 in the scanning direction. The ink-jet head 4 includes four jetting modules 16 aligning in the scanning direction. The four jetting modules 16 are connected respectively with a cartridge holder 7 installed with four ink cartridges 17 through undepicted tubes. The four ink cartridges retain inks of four colors (black, yellow, cyan, and magenta), respectively. Each of the jetting modules 16 has nozzles 24 (see FIG. 2A) formed on its lower surface (the surface on the far side of the page of FIG. 1). The nozzles 24 of each of the jetting modules 16 jet the ink of one color supplied from any one ink cartridge 17 toward the recording paper 100 placed on the platen 2.

The conveyance mechanism 5 has two conveyance rollers 18 and 19 arranged to interpose the platen 2 therebetween in a front/rear direction. With the two conveyance rollers 18 and 19, the conveyance mechanism 5 conveys the recording paper 100 placed on the platen 2 to the front side (also to be referred to below as in a conveyance direction).

The controller 6 includes a ROM (Read Only Memory), a RAM (Random Access Memory), and an ASIC (Application Specific Integrated Circuit) including various control circuits, etc. The controller 6 causes the ASIC to carry out various processes such as printing on the recording paper 100 and the like, according to programs stored in the ROM. For example, in a printing process, the controller 6 controls the ink-jet head 4, the carriage drive motor 15, and the like to print image and the like on the recording paper 100, based on a print command inputted from an external device such as a PC or the like. In particular, the controller 6 causes the relevant members to alternately carry out a jetting operation to jet the inks while moving the ink-jet head 4 together with the carriage 3 in the scanning direction, and a conveying operation to let the conveyance rollers 18 and 19 convey the recording paper 100 through a predetermined distance in the conveyance direction.

Next, a detailed explanation will be made about a configuration of the jetting modules 16 of the endless belt 14. Note that because the four jetting modules 16 have the same configuration with each other, the following explanation will be made about one of the four jetting modules 16.

As depicted in FIGS. 2A to 4C, the jetting module 16 includes a pressure chamber formation member 22, a COF (Chip On Film) 50, a cover 60, and the like. The pressure chamber formation member 22 includes a nozzle plate 20, a flow channel substrate 21, an insulation film 30, lower electrodes 32, a piezoelectric film 33, upper electrodes 34, individual traces 41, a common trace 42, and the like.

<Nozzle Plate 20>

Figure 2A:
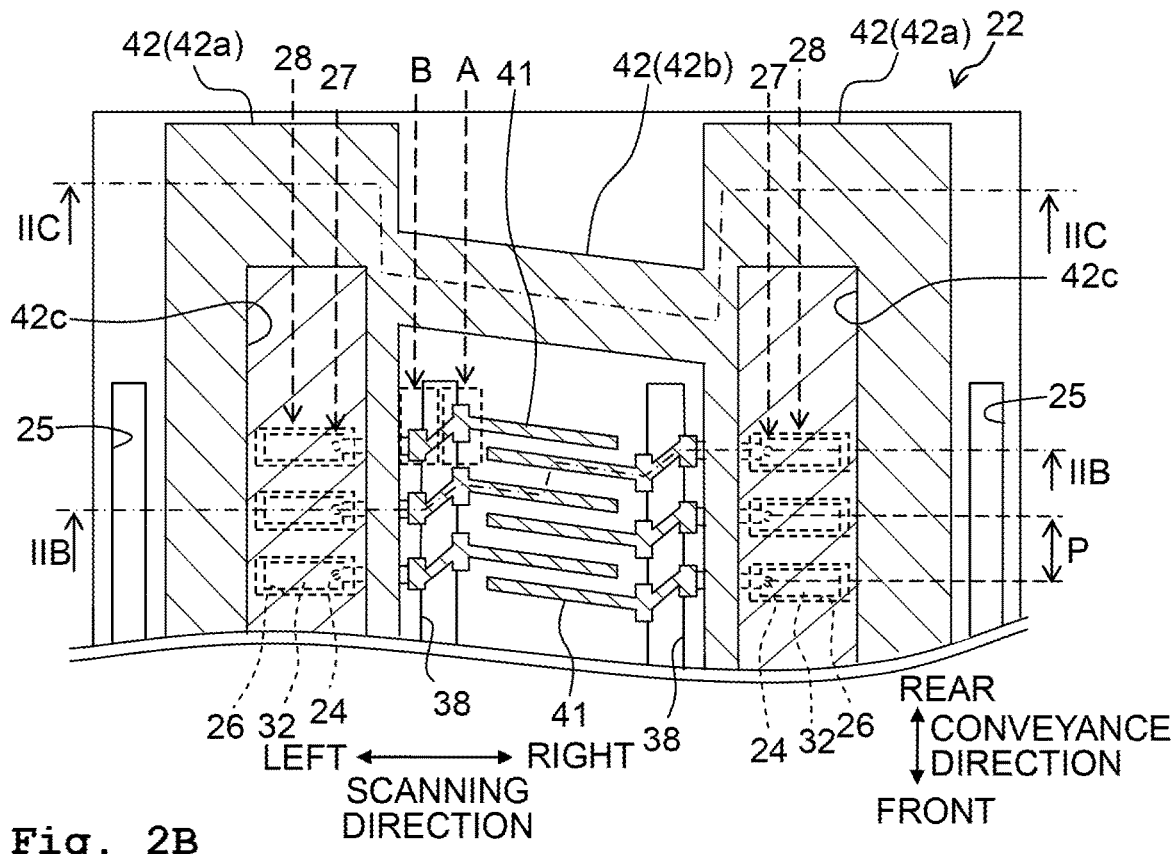

The nozzle plate 20 is, for example, a plate formed of silicon or the like. The nozzle plate 20 is formed with nozzles 24. As depicted in FIG. 2A, the nozzles 24 are arrayed along the conveyance direction to form two nozzle rows 27 aligning in the scanning direction. Further, if P is taken for the arrayal pitch of the nozzles 24 of one nozzle row 27, then between the two nozzle rows 27, the nozzles 24 are positioned to deviate by P/2 in the conveyance direction.

<Flow Channel Substrate 21>

The flow channel substrate 21 is formed of substrates 21a and 21b of a two-layer silicon single crystal. The substrate 21a is formed with pressure chambers 26 and part of aftermentioned manifolds 25. The substrate 21b is formed with flow channels for respective communications between the part of the manifolds 25, the pressure chambers 26 and the nozzles 24, and flow channels for respective communications between the pressure chambers 26 and the manifolds 25, etc. Each of the pressure chambers 26 has a rectangular planer shape elongated in the scanning direction. Hereinbelow, the scanning direction will also be referred to as "longitudinal direction (of the pressure chambers)", and the conveyance direction as "transverse direction (of the pressure chambers)". The pressure chambers 26 are arranged according to the abovementioned arrangement of the nozzles 24, to form two pressure chamber rows 28 aligning in the scanning direction. The lower surface of the flow channel substrate 21 is covered by the nozzle plate 20. As viewed in an up/down direction, one end portion of each pressure chamber 26 according to the longitudinal direction overlaps with the nozzle 24. The one end portion of each pressure chamber 26 according to the longitudinal direction is the end portion at the central side of the jetting module 16.

In left and right end portions of the flow channel substrate 21, the two manifolds 25 are formed to extend in the conveyance direction, corresponding respectively to the two pressure chamber rows 28. Each of the respective pressure chambers 26 forming one pressure chamber row 28 is in communication with the corresponding manifold 25.

Each of the manifolds 25 is connected with the cartridge holder 7 through an ink supply member (not depicted) including a tube or the like. The inks in the ink cartridges 17 installed in the cartridge holder 7 flow into the manifolds 25 via the above ink supply members to supply the respective pressure chambers 26 with the inks from the manifolds 25.

<Insulation Film 30>

Figure 2B:
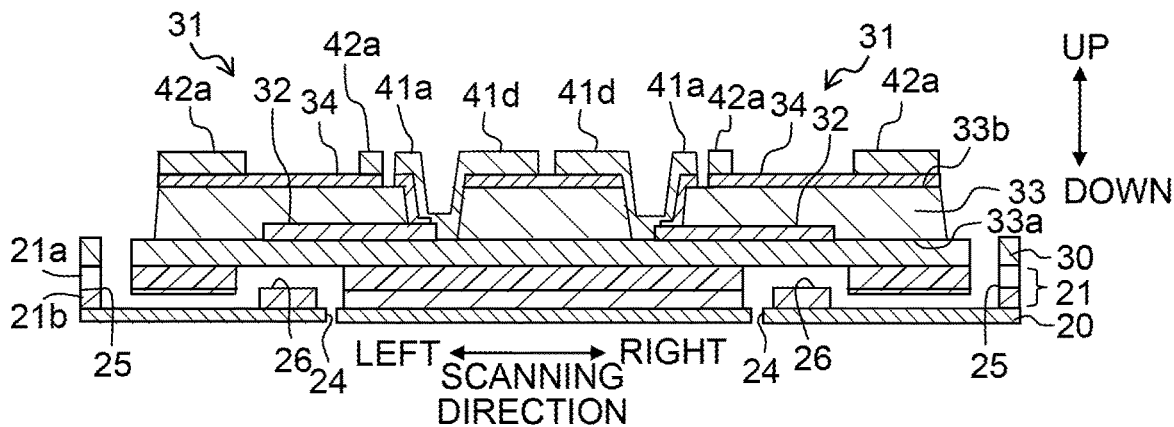

As depicted in FIG. 2B, the insulation film 30 covers the pressure chambers 26 formed in the flow channel substrate 21. The insulation film 30 of this embodiment is a dioxide silicon film formed by oxidizing a surface of the flow channel substrate 21, the film being integrated with the flow channel substrate 21. Note that the insulation film 30 is not limited to such a configuration but may be formed of another material on a surface of the flow channel substrate 21. The insulation film 30 is, for example, 1 to 2 μm thick.

<Lower Electrodes 32>

The lower electrodes 32 are arranged in such areas of the upper surface of the insulation film 30 as overlapping respectively with the pressure chambers 26. That is, the lower electrodes 32 are arranged in two rows in the scanning direction to correspond respectively to the two pressure chamber rows 28. In this embodiment, each lower electrode 32 has a first part 32a extending in the scanning direction, and a second part 32b further extending in the scanning direction from one end of the first part 32a in the scanning direction (the end at the central side of the jetting module 16). The first part 32a has a rectangular shape one size smaller than the planar shape of each pressure chamber 26, and the entire first part 32a overlaps with one pressure chamber 26. The width of the second part 32b along the conveyance direction is smaller than the width of the first part 32a along the conveyance direction. The lower electrodes 32 are supplied individually with a drive signal from an aftermentioned driver IC 53 through the individual traces 41. That is, the lower electrodes 32 are so-called individual electrodes each provided individually for the pressure chambers 26. The lower electrodes 32 are formed of, for example, platinum (Pt). Further, the lower electrodes 32 are, for example, 0.05 to 0.30 μm thick.

<Piezoelectric Film 33>

The piezoelectric film 33 is formed on the insulation film 30 and lower electrodes 32. The piezoelectric film 33 is formed of, for example, a piezoelectric material such as lead zirconate titanate (also PZT: Piezoelectric Zirconate Titanate) or the like. Alternatively, the piezoelectric film 33 may be formed of a piezoelectric material not containing lead. The piezoelectric film 33 is, for example, 1 to 2 μm thick.

The piezoelectric film 33 is formed with two through holes 38 aligning in the scanning direction. Each of the through holes 38 extends in the conveyance direction within the two opposite ends of the piezoelectric film 33 in the conveyance direction. The two through holes 38 are positioned within the two pressure chamber rows 28 in the scanning direction. In more detail, as depicted in FIG. 2A, the two through holes 38 are positioned between right end portions of the respective pressure chambers 26 forming the left pressure chamber row 28, and left end portions of the respective pressure chambers 26 forming the right pressure chamber row 28. As depicted in FIGS. 2A and 2B, the second part 32b of each lower electrode 32 extends in the scanning direction to the inside of the through hole 38. That is, a leading end portion of the second part 32b of each lower electrode 32 is exposed from the through hole 38. Note that in the following explanation, for the sake of convenience, the term "active portion" will be used to refer to such a part of the piezoelectric film 33 as at the outside of the two through holes 38 in the scanning direction, whereas the term "junction portion" will be used to refer to such a part of the piezoelectric film 33 as at the inside of the two through holes 38 in the scanning direction. Then, the term "intermediate portion" will be used to refer to such a part of the piezoelectric film 33 as between the active portion and the junction portion in the scanning direction where no through hole 38 is formed.

<Upper Electrodes 34>

An upper surface 33*b* of the piezoelectric film 33 is formed with the two upper electrodes 34 aligning in the scanning direction to correspond respectively to the two pressure chamber rows 28. Each of the upper electrodes 34 has a rectangular shape elongated in the conveyance direction to overlap entirely with the pressure chambers 26 forming the corresponding pressure chamber row 28 in the up/down direction. In more detail, all the pressure chambers 26 forming the corresponding pressure chamber row 28 are arranged within the two opposite ends of each upper electrode 34 in the scanning direction. That is, the two opposite ends of each pressure chamber 26 are positioned within the two opposite ends of the corresponding upper electrode 34 in the scanning direction. Further, the two upper electrodes 34 overlap respectively with the two rows of the lower electrodes 32 across the piezoelectric film 33. The upper electrodes 34 are formed of, for example, iridium. The upper electrodes 34 are, for example, 0.01 to 0.10 μm thick.

<Individual Traces 41>

Next, referring to FIGS. 2A, 2B, 3A and 3B, the individual traces 41 will be explained. The lower electrodes 32 aligning in the two rows are connected respectively with the individual traces 41. Each of the individual traces 41 extends from the upper surface of the active portion to the upper surface of the junction portion of the piezoelectric film 33 across the through hole 38. Each individual trace 41 is connected to the leading end portion, exposed from the through hole 38, of the second part 32*b* of the corresponding lower electrode 32.

Each individual trace 41 is formed from a conductive portion 41*a*, a first extending portion 41*b* continuing from the conductive portion 41*a*, a second extending portion 41*c* continuing from the first extending portion 41*b*, and a third extending portion 41*d* continuing from the second extending portion 41*c*. The conductive portion 41*a* is formed along the upper surface of the active portion of the piezoelectric film 33 and an inner surface 33*c* formed due to the through hole 38 at the active portion side. The first extending portion 41*b* is formed along the upper surface of the insulation film 30 to overlap with the part, exposed from the through hole 38, of the second part 32*b* of the lower electrode 32. The second extending portion 41*c* is formed along an inner surface 33*d* formed due to the through hole 38 at the junction portion side. The third extending portion 41*d* is formed along the upper surface of the junction portion of the piezoelectric film 33.

Because the second extending portion 41*c* is formed along an inner surface 38*b* of the through hole 38 at the junction portion side, the second extending portion 41*c* is likely to become thinner than the first extending portion 41*b* formed on the upper surface of the insulation film 30. Therefore, in this embodiment, the width d2 of the second extending portion 41*c* along the conveyance direction is larger than the width d1 of the first extending portion 41*b* along the conveyance direction in a central portion along the scanning direction. By virtue of this, in the second extending portion 41*c*, the individual trace 41 is prevented from decrease in electric resistance. From the same reason, the width d5 of the conductive portion 41*a* along the conveyance direction is larger than the width d1 of the first extending portion 41*b* along the conveyance direction in the central portion along the scanning direction.

The third extending portion 41*d* has a wide part 41*d*1 and a narrow part 41*d*2 which are continuous in the scanning direction. The width d3 of the wide part 41*d*1 along the conveyance direction is larger than the width d4 of the narrow part 41*d*2 along the conveyance direction.

In this embodiment, the first extending portion 41*b* and the third extending portion 41*d* are inclined respectively at different angles to the scanning direction. That is, when viewed from above, each individual trace 41 extends in the scanning direction while inflecting at a plurality of places. Each individual trace 41 is formed of, for example, gold (Au). The conductive portion 41*a* is, for example, 0.5 to 2.0 μm thick. The first extending portion 41*b* is, for example, also 0.5 to 2.0 μm thick. The second extending portion 41*c* is, for example, 0.3 to 1.5 μm thick. The third extending portion 41*d* is, for example, 0.5 to 2.0 μm thick.

As depicted in FIGS. 2A and 2B, on the junction portion of the piezoelectric film 33, there are aligned alternately in the conveyance direction the third extending portions 41*d* corresponding respectively to the lower electrodes 32 on the left, and the third extending portions 41*d* corresponding respectively to the lower electrodes 32 on the right. The third extending portions 41*d* are joined with an aftermentioned COF 50. That is, each of the third extending portions 41*d* has a drive contact point 46 as a contact point with the COF 50.

<Common Trace 42>

The common trace 42 is constructed from two circular portions 42*a* formed respectively on the upper surfaces of the two upper electrodes 34, and two extending portions 42*b* connecting the two circular portions 42*a* in their respective leading end portions along the conveyance direction.

Figure 2C:
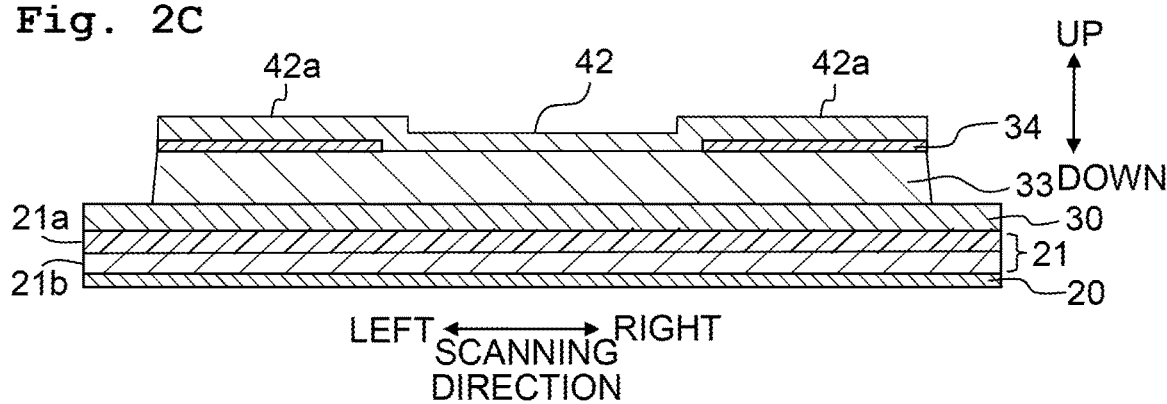
Figure 3A:
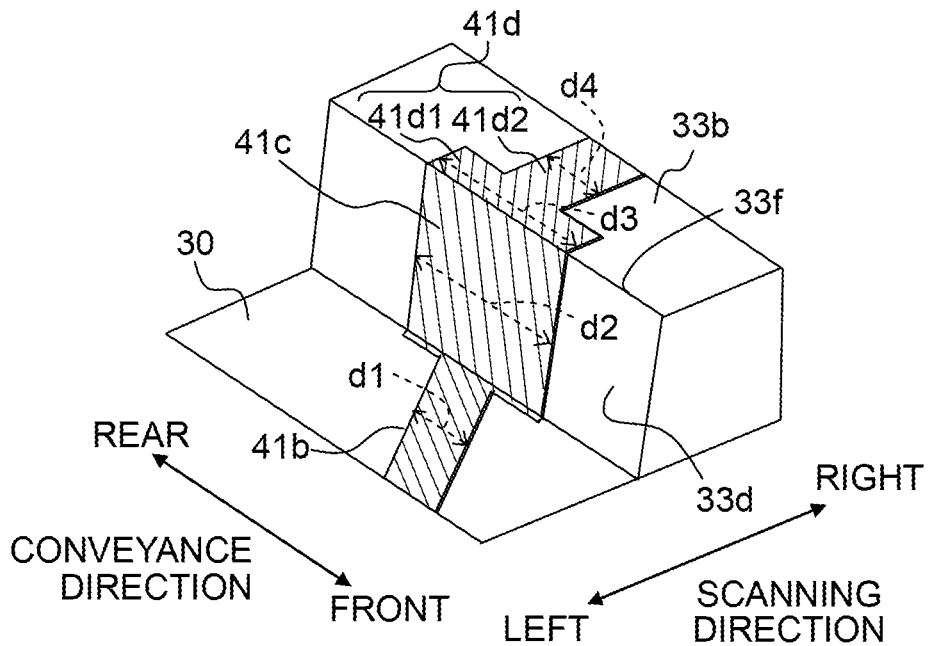
Figure 3B:
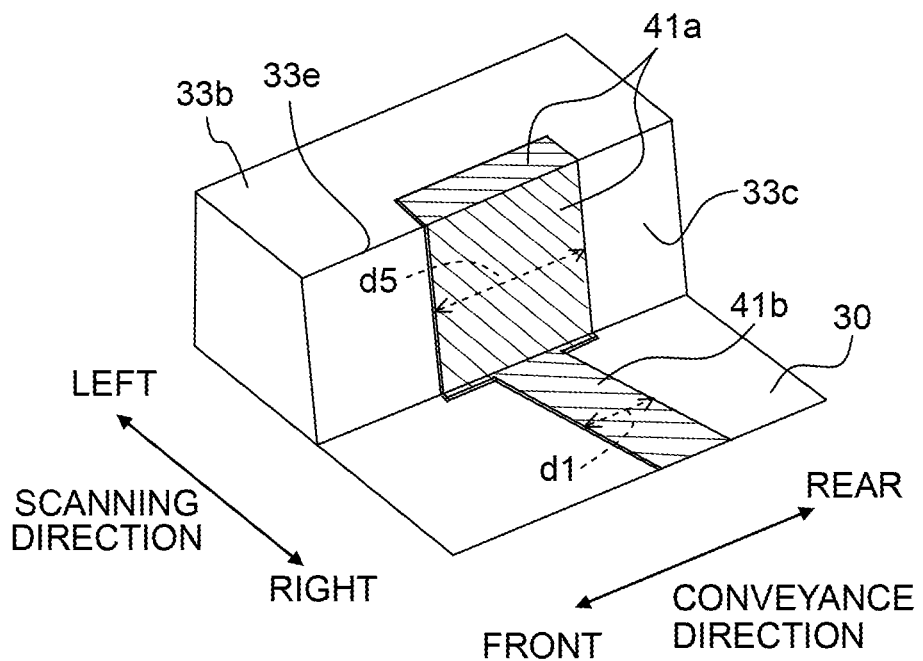

As depicted in FIGS. 2A to 2C, the circular portions 42*a* of the common trace 42 are formed on the upper surfaces of the respective upper electrodes 34. A rectangular opening 42*c* elongated in the conveyance direction is formed in a central portion of each circular portion 42*a* along the scanning direction and along the conveyance direction. The two opposite ends of each opening 42*c* along the conveyance direction are positioned outside the pressure chambers 26 positioned at the two opposite ends along the conveyance direction among the pressure chambers 26 forming the corresponding pressure chamber row 28. The part of the upper electrode 34, exposed from the opening 42*c*, overlaps with the all corresponding pressure chambers 26.

As depicted in FIG. 2A, each of the two extending portions 42*b* of the common trace 42 is formed in such a part of the piezoelectric film 33 as outside the two through holes 38 along the conveyance direction. In other words, each of the two extending portions 42*b* of the common trace 42 is formed in such a part of the piezoelectric film 33 as without the through hole 38 at one or the other of the two opposite end sides along the conveyance direction. Further, as depicted in FIG. 2C, each extending portion 42*b* extends while being inclined with respect to the scanning direction along the upper surfaces of the active portion, intermediate portion and junction portion of the piezoelectric film 33. Then, the two opposite ends of each extending portion 42*b* along the scanning direction are connected to the two circular portions 42*a*. That is, each extending portion 42*b* overlaps entirely with the upper surface 33b of the piezoelectric film 33. In other words, the piezoelectric film 33 is positioned between the insulation film 30 and each extending portion 42b along the up/down direction. The aforementioned COF 50 is joined to such a part of each extending portion 42b as overlapping with the junction portion of the piezoelectric film 33. That is, there is a ground contact point 48 as the contact point with the COF 50, in the part of each extending portion 42b overlapping with the junction portion of the piezoelectric film 33.

The common trace 42 is formed of, for example, gold (Au). The circular portions 42a of the common trace 42 are, for example, 0.5 to 2.0 μm thick, while the extending portions 42b are, for example, also 0.5 to 2.0 μm thick.

<COF 50>

The COF 50 includes a base material 51, traces 52 formed in the base material 51, a driver IC 53 mounted on the base material 51, and the like. As depicted in FIGS. 4B and 4C with the broken lines, the base material 51 has a junction portion 51a joined to the pressure chamber formation member 22 and arranged along the upper surface of the piezoelectric film 33, a draw-out portion 51b drawn out upward to be away from the pressure chamber formation member 22, and a curved portion 51c between the junction portion 51a and the draw-out portion 51b. Further, the COF 50 is inserted into a through hole 62 of the aftermentioned cover 60 to join to the third extending portion 41d of each individual trace 41 and the extending portions 42b of the common trace 42.

As depicted in FIGS. 4B and 4C, the junction portion 51a of the base material 51 is joined to the upper surface of the junction portion of the piezoelectric film 33, where the drive contact points 46 and the two ground contact points 48 are arranged. The driver IC 53 is mounted on the draw-out portion 51b of the base material 51. Further, while illustration is omitted, the other end of the COF 50 is connected to the controller 6 of the ink-jet printer 1 (see FIG. 1). When the COF 50 is joined to the pressure chamber formation member 22, the end portions of the traces 52 formed on the base material 51 are connected electrically with the drive contact points 46 and the two ground contact points 48.

The driver IC 53 generates a drive signal based on a control signal fed from the controller 6. The drive signal is inputted to a drive contact point 46 via the trace 52 and, furthermore, supplied to the corresponding lower electrode 32 via the individual trace 41. On this occasion, the lower electrode 32 changes between a predetermined drive potential and the ground potential. On the other hand, the ground potential is applied to the upper electrode 34 connected with the ground contact point 48 through the common trace 42.

Next, an explanation will be made about an interaction between the pressure chamber 26 and the insulation film 30, lower electrode 32, piezoelectric film 33 and upper electrode 34, when the drive signal is supplied from the driver IC 53.

If the drive signal is not yet inputted, then the lower electrode 32 is at the ground potential, being the same as the upper electrode 34. From this state, if the drive signal is inputted to the lower electrode 32, then due to the potential difference between the lower electrode 32 and the upper electrode 34, an electric field is acting in the thickness direction on such a part of the piezoelectric film 33 as nipped between the lower electrode 32 and the upper electrode 34. On this occasion, due to the inverse piezoelectric effect, that part of the piezoelectric film 33 being nipped between the lower electrode 32 and the upper electrode 34 contracts in the planar direction.

On this occasion, those parts overlapping with the pressure chamber 26, of the insulation film 30, the lower electrode 32, the piezoelectric film 33, and the upper electrode 34, bend to project toward the pressure chamber 26, such that the pressure chamber 26 decreases in volume. By virtue of this, a pressure wave occurs in the pressure chamber 26 to jet ink droplets from the nozzle 24 in communication with the pressure chamber 26. In the following explanation, the term "piezoelectric element 31" will be used to refer to the part of the lower electrode 32, piezoelectric film 33 and upper electrode 34 overlapping with one pressure chamber 26. That is, piezoelectric elements 31 are arranged to correspond respectively to the pressure chambers 26. Then, the piezoelectric elements 31 are arranged in two rows along the scanning direction to correspond respectively to the two pressure chamber rows 28.

<Cover 60>

Figure 4A:
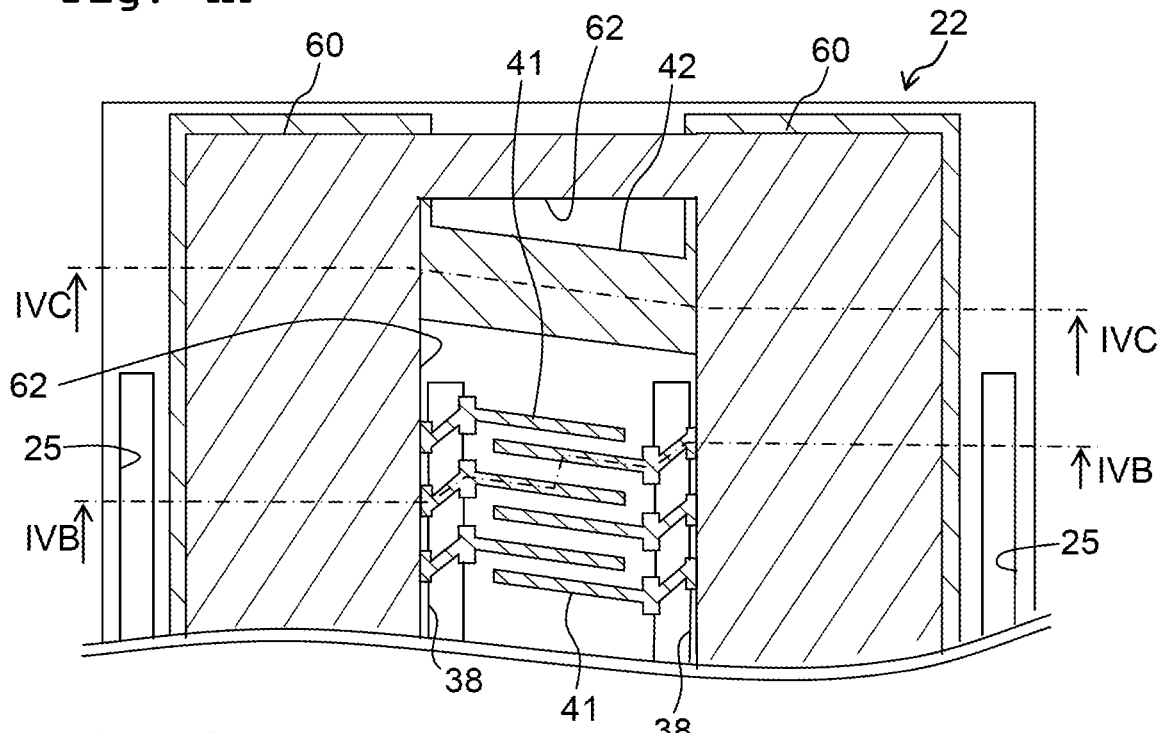
Figure 4B:
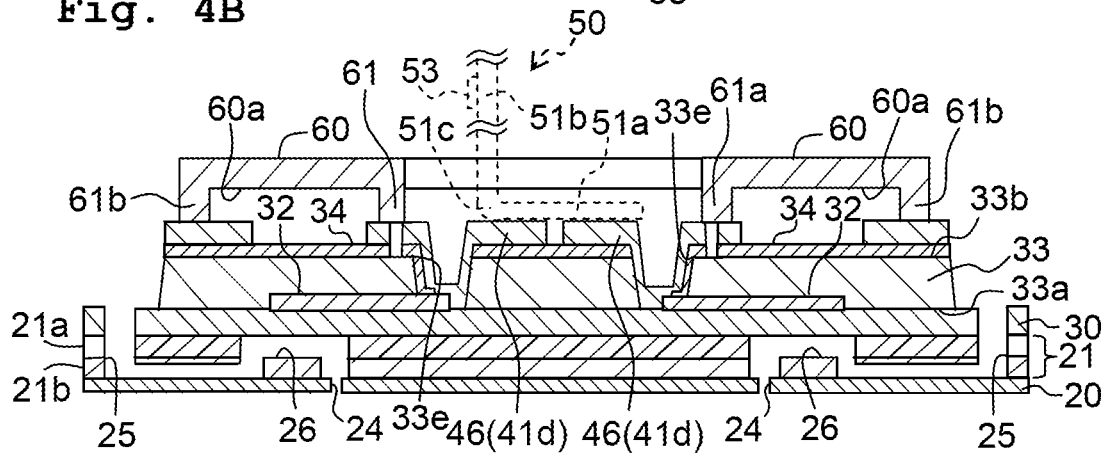
Figure 4C:
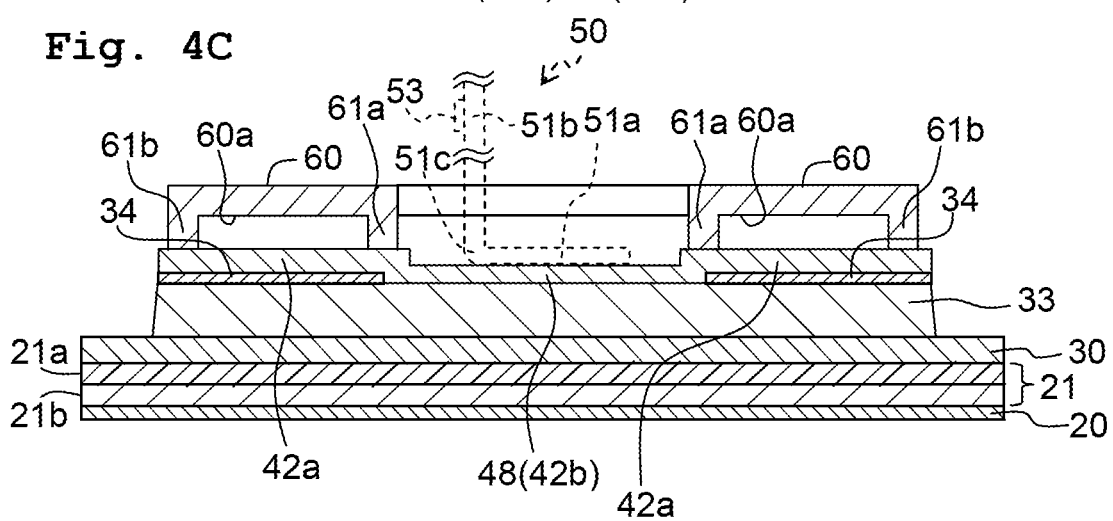
Figure 5:
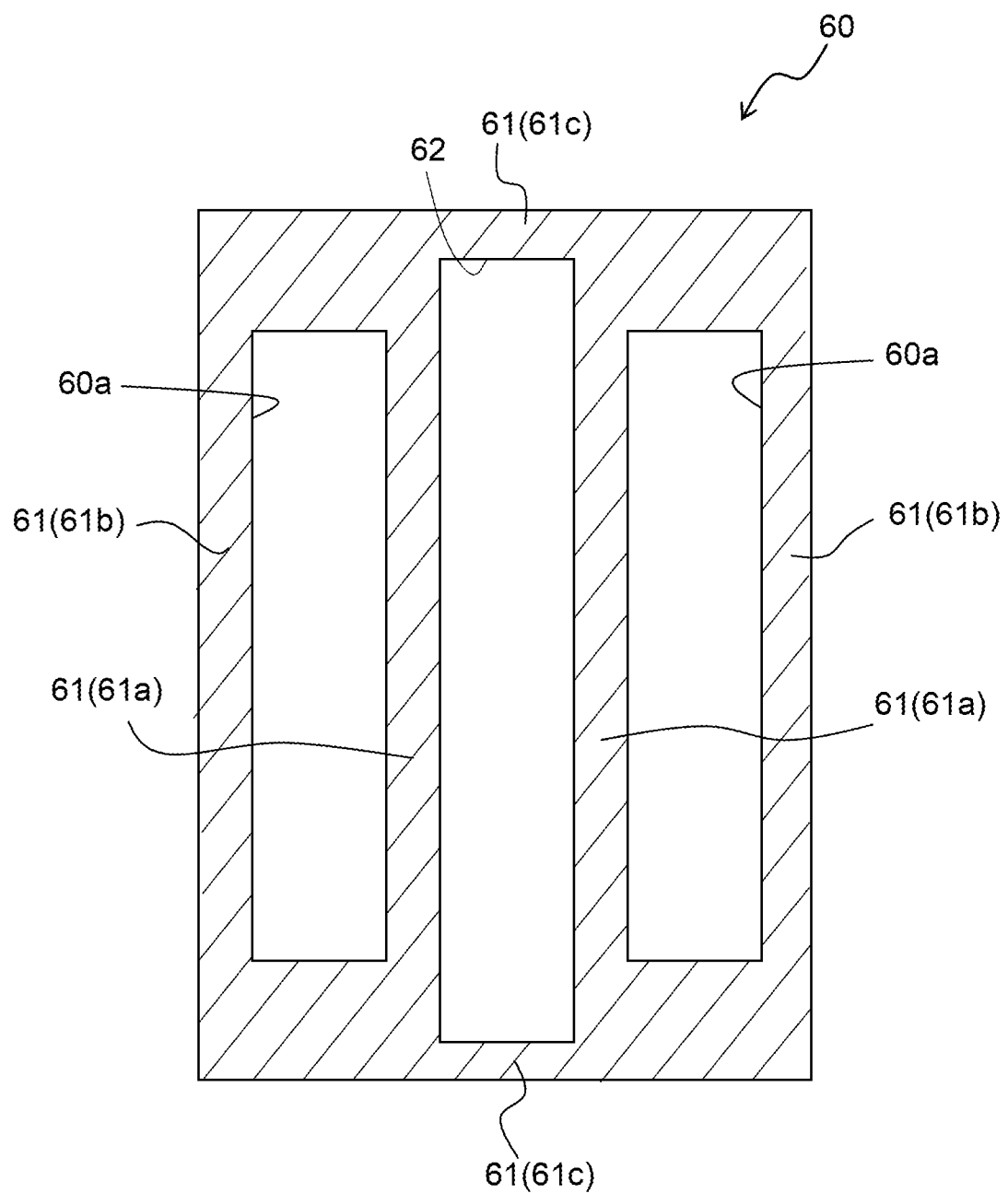
FIG. 5 is a bottom view of the cover.

As depicted in FIGS. 4A to 4C, the cover 60 is joined to the pressure chamber formation member 22 with an adhesive. The outer circumference of the cover 60 has a rectangular shape elongated in the conveyance direction, and a rectangular through hole 62 elongated in the conveyance direction is formed in a central portion along the conveyance direction and along the scanning direction. As depicted in FIG. 5, two concave portions 60a are formed in the lower surface of the cover 60 to align in the scanning direction across the through hole 62. Each of the concave portions 60a has an outer edge in a rectangular shape elongated in the conveyance direction. Each concave portion 60a is as deep as not impeding the drive of each piezoelectric element 31 in the up/down direction. On the other hand, a convex portion 61 is formed in such a part of the lower surface of the cover 60 as without the through hole 62 and the concave portions 60a, to project downward from the bottom surface of each concave portion 60a. In the following explanation, the name "first convex portions 61a" will be used to refer to such parts of the convex portion 61 as extending along the long side of one of the concave portions 60a to the two short sides of that concave portion 60a, while the name "second convex portions 61b" will be used to refer to such parts of the convex portion 61 as extending along the long side of the other of the concave portions 60a to the two short sides of that concave portion 60a. Further, the name "third convex portions 61c" will be used to refer to such parts of the convex portion 61 as other than the first convex portions 61a and second convex portions 61b.

The cover 60 is joined with the pressure chamber formation member 22 on the lower surfaces of the first convex portions 61a, the lower surfaces of second convex portions 61b, and the lower surfaces of third convex portions 61c. In more detail, the lower surfaces of the first convex portions 61a are joined with the circular portions 42a of the common trace 42 and such a part of the conductive portion 41a of each individual trace 41 as formed on the upper surface of the piezoelectric film 33. The circular portions 42a of the common trace 42 are joined to the lower surfaces of the second convex portions 61b and the lower surfaces of the third convex portions 61c.

The respective pressure chambers 26 forming the left pressure chamber row 28 are positioned between the left first convex portion 61a and the left second convex portion 61b in the scanning direction. In more detail, the two opposite ends of the pressure chambers 26 forming the left pressure chamber row 28 along the scanning direction are positioned between the left first convex portion 61a and the left second convex portion 61b in the scanning direction, such that the respective pressure chambers 26 do not overlap with the left first convex portion 61a and the left second convex portion 61b. As depicted in FIG. 4B, the left first convex portion 61a is positioned between the left through hole 38 of the piezoelectric film 33 and the right ends of the left respective pressure chambers 26, in the scanning direction. In more detail, the two opposite ends of the junction surface along the scanning direction between the left first convex portion 61a and the pressure chamber formation member 22 are positioned between the right ends of the left respective pressure chambers 26 and an angular portion 33e formed by the upper surface 33b of the piezoelectric film 33 and the left inner surface 33c at the active portion side. Further, in the following explanation, the angular portion 33e will be used to refer to such a part of the outer surface with the smallest curvature radius as formed by the upper surface 33b of the piezoelectric film 33 and the inner surface 33c at the active portion side. Further, the name "angular portion 33f" will be used to refer to such a part of the outer surface with the smallest curvature radius as formed by the upper surface 33b of the piezoelectric film 33 and the inner surface 33d at the junction portion side.

Likewise, the respective pressure chambers 26 forming the right pressure chamber row 28 are positioned between the right first convex portion 61a and the right second convex portion 61b in the scanning direction. In more detail, the two opposite ends of the pressure chambers 26 forming the right pressure chamber row 28 along the scanning direction are positioned between the right first convex portion 61a and the right second convex portion 61b in the scanning direction, such that the respective pressure chambers 26 do not overlap with the right first convex portion 61a and the right second convex portion 61b. As depicted in FIG. 4B, the right first convex portion 61a is positioned between the right through hole 38 of the piezoelectric film 33 and the left ends of the right respective pressure chambers 26, in the scanning direction. In more detail, the two opposite ends of the junction surface along the scanning direction between the right first convex portion 61a and the pressure chamber formation member 22 are positioned between the left ends of the right respective pressure chambers 26 and another angular portion 33e formed by the upper surface 33b of the piezoelectric film 33 and the right inner surface 33c at the active portion side.

Figure 6:
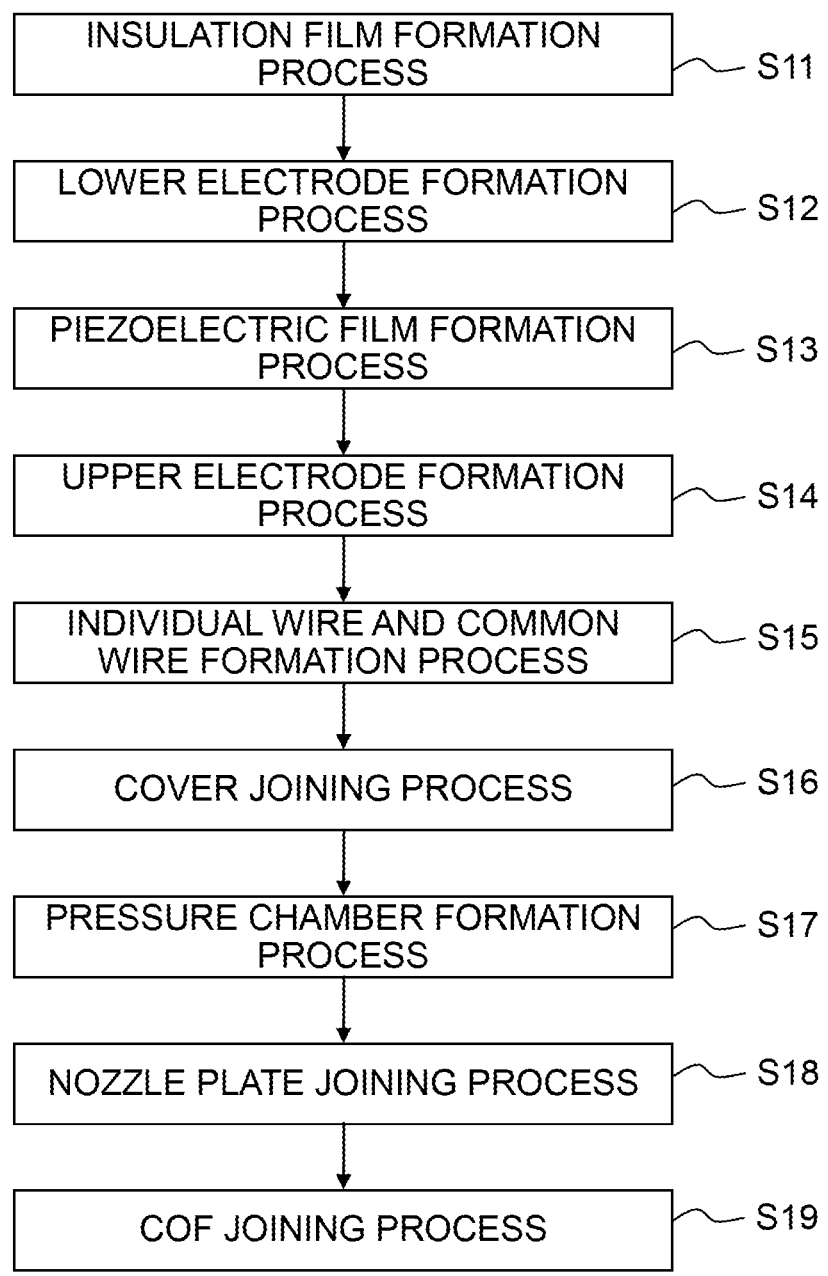
FIG. 6 is a flow chart depicting a process of manufacturing a jetting module.

Next, referring to FIG. 6, an explanation will be made about a process for manufacturing the aforementioned jetting module 16.

First, the insulation film 30 is formed on a surface of a silicon single crystal substrate, which will become the substrate 21a of the flow channel substrate 21, by a method such as thermal oxidation or the like (step S11). Next, a conductive film for the lower electrodes 32 is formed on the insulation film 30 by way of sputtering or the like. The conductive film for the lower electrodes 32 is patterned by way of etching, to form the lower electrodes 32 having the first parts 32a and the second parts 32b (step S12).

Next, on the insulation film 30 formed with the lower electrodes 32, the piezoelectric film 33 is formed by the sol-gel or sputtering method. The through holes 38 are formed in the piezoelectric film 33 by way of etching (step S13).

Next, on the piezoelectric film 33, a conductive film for the upper electrodes 34 is formed by way of sputtering or the like. The conductive film for the upper electrodes 34 is patterned by way of etching, to form the upper electrodes 34 (step S14).

Next, the method of plating is used to form the individual traces 41 in the aforementioned shape and the common trace 42 in the aforementioned shape (step S15).

Next, the cover 60 is joined with an adhesive to the above position of the pressure chamber formation member 22 (step S16).

Next, the pressure chamber formation member 22 joined with the cover 60 is tuned back and, with the pressure chamber formation member 22 being supported with the cover 60, the substrate 21a is ground which will become part of the flow channel substrate 21. After the substrate 21a is ground to a predetermined thickness, the ground surface of the substrate 21a is etched to form the pressure chambers 26. After the pressure chambers 26 are formed, the ground surface of the substrate 21a is attached to the substrate 21b where various flow channels are formed by etching beforehand to communicate with the pressure chambers 26 (step S17).

After the substrate 21a is attached to the substrate 21b, the nozzle plate 20 is joined to the substrate 21b (step S18). Finally, the COF 50 is joined to the above position of the pressure chamber formation member 22 (step S19).

According to the above embodiment, the third extending portion 41d of each individual trace 41 and the extending portion 42b of the common trace 42 are all arranged on the junction portion of the piezoelectric film 33. Then, the COF 50 is joined with the third extending portion 41d of each individual trace 41 and the extending portion 42b of the common trace 42, upon the junction portion of the piezoelectric film 33. Because the third extending portion 41d of each individual trace 41 and the extending portion 42b of the common trace 42 are positioned at the same height, it is possible to join the COF 50, each individual trace 41 and the common trace 42 with high reliability.

Further, according to the above embodiment, the drive contact points 46 and the ground contact points 48 are not covered by the cover 60. Therefore, even though the substrate 21a is ground with the pressure chamber formation member 22 being supported with the cover 60, there is still no load on the drive contact points 46 and the ground contact points 48. Hence, defection is less likely to arise in the process for manufacturing the jetting module 16.

Further, according to the above embodiment, the left first convex portion 61a is positioned on the left of the through hole 38 at the left side of the piezoelectric film 33 according to the scanning direction, while the right first convex portion 61a is positioned on the right of the through hole 38 at the right side of the piezoelectric film 33 according to the scanning direction. That is, the left first convex portion 61a and the right first convex portion 61a are positioned on the outside of the two through holes 38 of the piezoelectric film 33 according to the scanning direction. Therefore, it is possible to secure a sufficient area of the pressure chamber formation member 22 for joining the COF 50.

In the above embodiment, the jetting modules 16 correspond to the "liquid jetting apparatus" of the present teaching. The lower electrodes 32 correspond to the "first electrodes" of the present teaching. The upper electrodes 34 correspond to the "second electrode" of the present teaching. The conveyance direction (the transverse direction of the pressure chambers) corresponds to the "first direction" of the present teaching, while the scanning direction (the longitudinal direction of the pressure chambers) corresponds to the "second direction" of the present teaching. Further, the up/down direction corresponds to the "third direction" of the present teaching. The inner surface 33c of the piezoelectric film 33 corresponds to the "first inner surface" of the present teaching, while the inner surface 33*d* corresponds to the "second inner surface" of the present teaching. The angular portion 33*e* corresponds to the "first angular portion" of the present teaching, while the angular portion 33*f* corresponds to the "second angular portion" of the present teaching.

Next, explanations will be made about modified embodiments applying various changes and/or modifications to the above embodiment. However, the same numeral or alphanumeral is assigned to each component having the same configuration as that in the above embodiment, and explanation therefor will be omitted as appropriate.

In the above embodiment, the two opposite ends of the pressure chambers 26 forming the left pressure chamber row 28 along the scanning direction are positioned between the left first convex portion 61*a* and the left second convex portion 61*b* in the scanning direction. However, without being limited to that, it is allowable for the centers of the pressure chambers 26 forming the left pressure chamber row 28 along the scanning direction to be positioned between the left first convex portion 61*a* and the left second convex portion 61*b* in the scanning direction. Likewise, it is allowable for the centers of the pressure chambers 26 forming the right pressure chamber row 28 along the scanning direction to be positioned between the right first convex portion 61*a* and the right second convex portion 61*b* in the scanning direction.

Figure 7A:
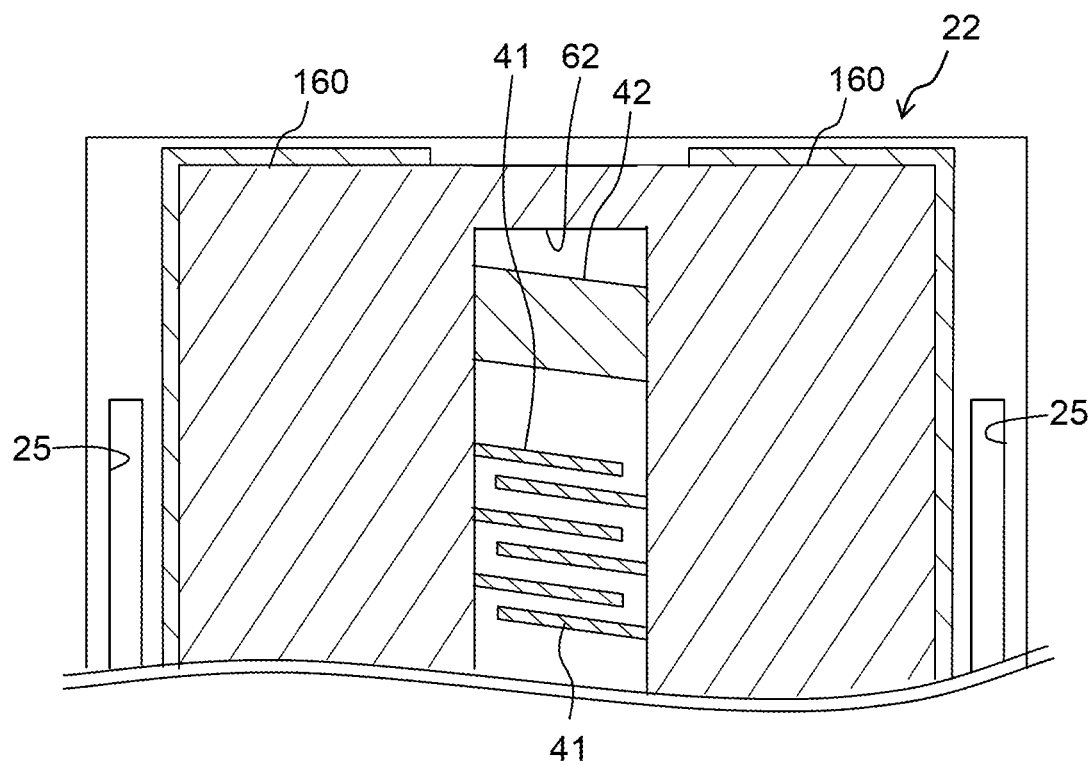
Figure 7B:
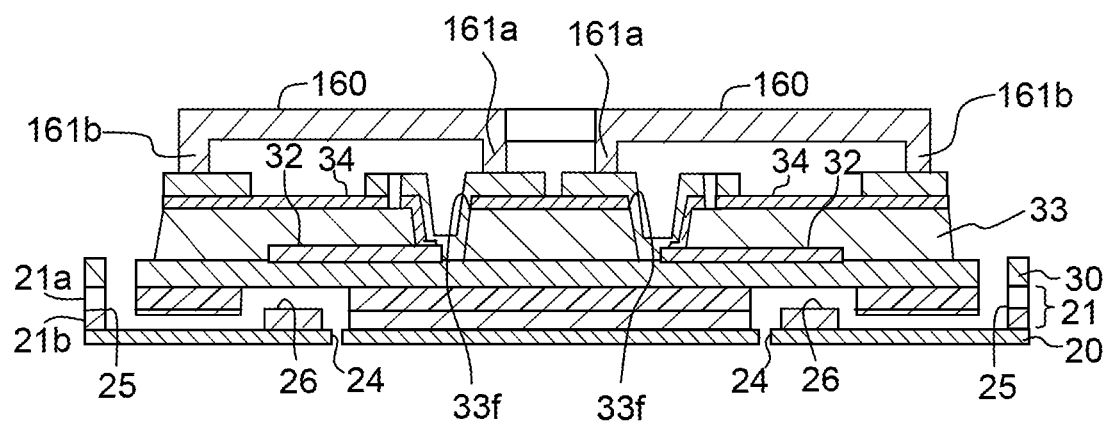

The left first convex portion 61*a* and the right first convex portion 61*a* may not be positioned on the outside of the two through holes 38 of the piezoelectric film 33 according to the scanning direction. For example, as depicted in FIGS. 7A and 7B, a left first convex portion 161*a* and a right first convex portion 161*a* may be positioned on the inside of the two through holes 38 of the piezoelectric film 33 according to the scanning direction (a first modified embodiment). That is, the left first convex portion 161*a* and the right first convex portion 161*a* may be positioned on the outside of the left second angular portion 33*f* and the right second angular portion 33*f* according to the scanning direction. In this case, because the junction portion between each first convex portion 161*a* and the pressure chamber formation member 22 is away from the respective piezoelectric elements 31, it is possible to prevent the adhesive from flowing out to any of the piezoelectric elements 31 to give rise to variation in the displacement feature of the piezoelectric elements 31.

Figure 8A:
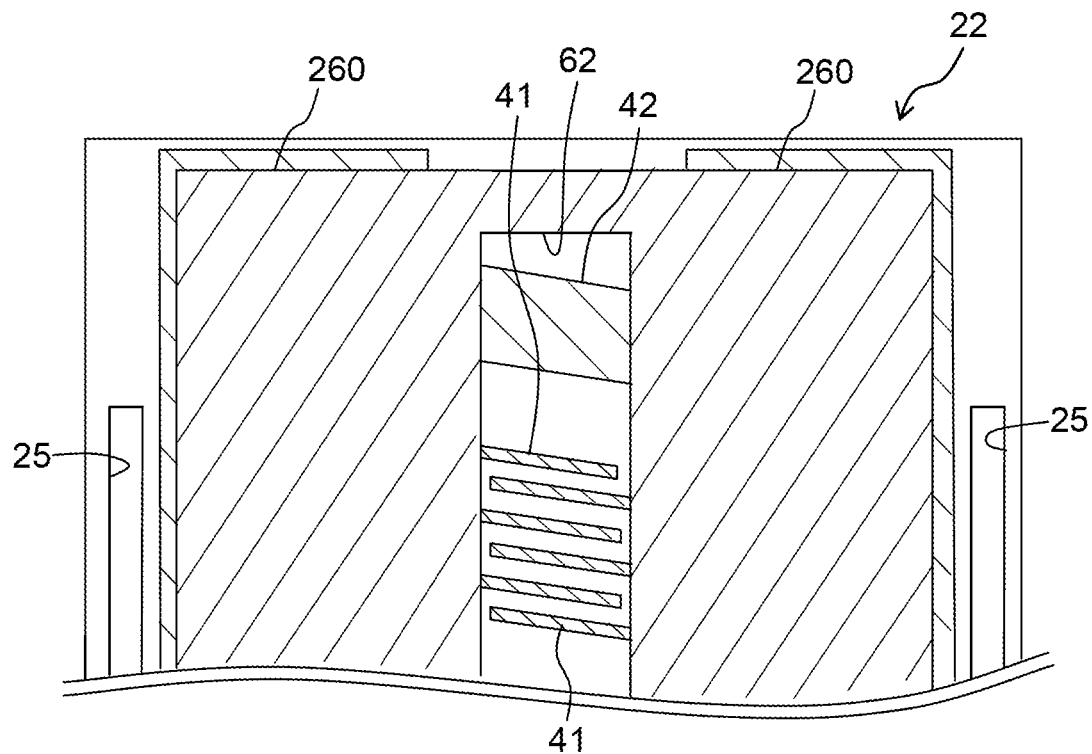
Figure 8B:
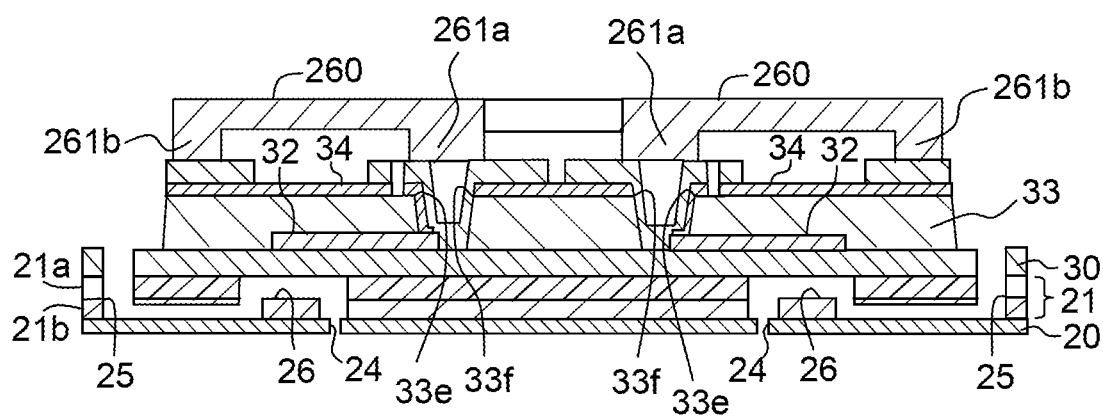

Alternatively, as depicted in FIGS. 8A and 8B, a left first convex portion 261*a* and a right first convex portion 261*a* may overlap respectively with the two through holes 38 of the piezoelectric film 33 (a second modified embodiment). That is, each first convex portion 261*a* may have a larger width along the scanning direction than the distance along the scanning direction between the angular portion 33*e* and the angular portion 33*f*, i.e., the width of each through hole 38 along the scanning direction. In this case, when a cover 260 is joined to the pressure chamber formation member 22, the angular portion of each first convex portion 261*a* comes into the through hole 38 such that it is possible to prevent giving damage to such a part of each individual trace 41 as formed inside the through hole 38.

Figure 9A:
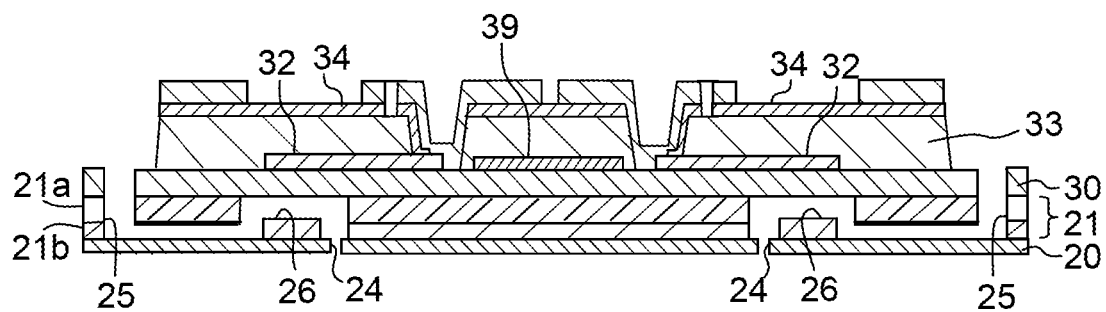
Figure 9B:
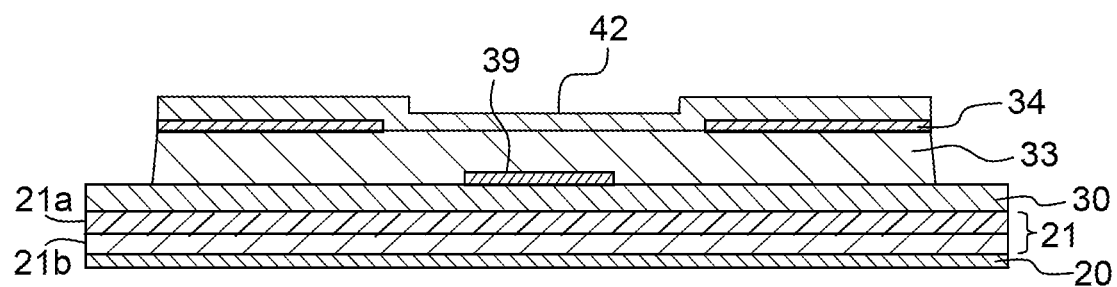

As depicted in FIGS. 9A and 9B, a film 39 may be formed of the same material as the lower electrodes 32, between the junction portion of the piezoelectric film 33 and the insulation film 30 (a third modified embodiment). This film 39 may be patterned together with the lower electrodes 32 after the conductive film for the lower electrodes 32 is formed. By virtue of this, steps are formed at the upper surface of the junction portion of the piezoelectric film 33, and at the extending portion 42*b* of the common trace 42 and the third extending portion 41*d* of each individual trace 41 which are formed on the upper surface of the junction portion of the piezoelectric film 33. Therefore, it is possible to join the COF 50 more reliably with the extending portion 42*b* of the common trace 42 and the third extending portion 41*d* of each individual trace 41.

Figure 10:
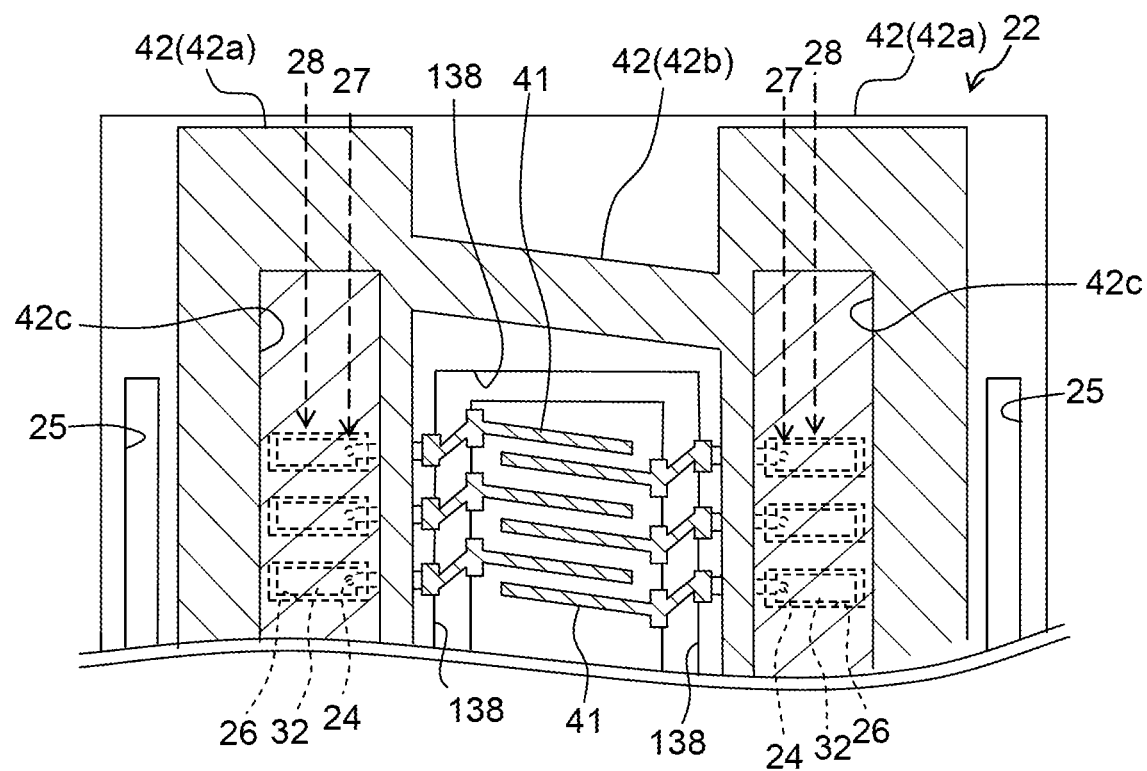
FIG. 10 is a plan view, corresponding to FIG. 2A, of the pressure chamber formation substrate of a jetting module according to a fourth modified embodiment of the present teaching.

As depicted in FIG. 10, such a slit 138 may be formed as circularly continuous along the planar direction of the piezoelectric film 33, in a central portion of the piezoelectric film 33 according to the scanning direction and the conveyance direction. By virtue of this, the piezoelectric film 33 may be defined as a first part inside the inner circumference of the circularly continuous slit 138 in the planar direction of the piezoelectric film 33, and a second part outside the inner circumference of the circularly continuous slit 138 in the planar direction of the piezoelectric film 33 but inside the outer edge of the piezoelectric film 33 in the planar direction of the piezoelectric film 33 (a fourth modified embodiment).

The two upper electrodes 34 may connected in the corresponding end portions according to the conveyance direction with the same material as the upper electrodes 34, along the scanning direction.

The cover 60 may be formed as two different covers each of which has one concave portion 60*a*.

The COF 50 is merely an example of the wiring member of the present teaching, and the wiring member of the present teaching may include a flexible base material and traces formed in the base material.

An additional layer may be included, as far as without impeding the drive of the piezoelectric elements 31, between the insulation film 30 and the lower electrodes 32, between the lower electrodes 32 and the piezoelectric film 33, between the piezoelectric film 33 and the upper electrodes 34, between the upper electrodes 34 and the common trace 42, between the piezoelectric film 33 and the common trace 42, between each individual trace 41 and the insulation film 30, between each individual trace 41 and the piezoelectric film 33, and/or the like.

In the embodiment explained above, the present teaching is applied to an ink-jet head for jetting ink to recording paper to print image and the like. However, the present teaching is also applicable to liquid jetting apparatuses used for various purposes other than printing image and the like. For example, it is also possible to apply the present teaching to liquid jetting apparatuses for jetting a conductive liquid to a substrate, for example, to form a conductive pattern on a surface of the substrate.

What is claimed is:
1. A liquid jetting apparatus comprising:
a pressure chamber formation member having first pressure chambers arranged in a first direction, and an insulation film covering the first pressure chambers; and
a cover joined to the pressure chamber formation member, the cover having a first convex portion and a second convex portion, each of the first convex portion and the second convex portion having a bonding surface to the pressure chamber formation member and extending in the first direction,
wherein the first pressure chambers have first ends aligned in the first direction, second ends aligned in the first direction, and centers positioned between the first ends and the second ends in a second direction which is along a planar direction of the insulation film and orthogonal to the first direction; the centers of the respective first pressure chambers being positioned between the first convex portion and the second convex portion of the cover in relation to the second direction,
the pressure chamber formation member has:
   first electrodes overlapping respectively with the first pressure chambers in a third direction orthogonal to the planar direction of the insulation film, while sandwiching the insulation film therebetween;
   a piezoelectric layer overlapping with the insulation film and the first electrodes in the third direction;
   a second electrode overlapping with the first electrodes in the third direction, while sandwiching the piezoelectric layer therebetween;
   first traces connected respectively with the first electrodes; and
   a second trace connected with the second electrode,
the piezoelectric layer has a first surface facing the insulation film and the first electrodes, and a second surface on a side opposite to the insulation film and the first electrodes with respect to the first surface,
the second trace is configured to contact a wiring member,
the second trace includes an extending portion extending continuously from the second electrode to a contact point with the wiring member, and
the piezoelectric layer is positioned between the insulation film and the extending portion of the second trace in relation to the third direction.

2. The liquid jetting apparatus according to claim 1, wherein a first through hole is formed in the piezoelectric layer to extend in the first direction, the first through hole being formed on a side opposite to the second ends in the second direction with respect to the first ends,
the piezoelectric layer has a first inner surface and a second inner surface being formed by the first through hole and extending respectively in the first direction,
the first inner surface is positioned between the second inner surface and the first ends in relation to the second direction, and
the bonding surface of the first convex portion to the pressure chamber formation member has both ends in the second direction, the both ends in the second direction being positioned between the first ends and a first angular portion of the piezoelectric layer in the second direction, the first angular portion being formed by the second surface and the first inner surface of the piezoelectric layer.

3. The liquid jetting apparatus according to claim 2, wherein each of the first traces has:
   a first extending portion extending from one of the first electrodes along the insulation film;
   a second extending portion extending from one end of the first extending portion in the second direction, along the first inner surface of the piezoelectric layer; and
   a third extending portion extending from one end of the second extending portion in the third direction, along the second surface of the piezoelectric layer and, the third extending portion having a contact point with the wiring member, and
the width of the second extending portion in the first direction is larger than the width of the first extending portion in the first direction.

4. The liquid jetting apparatus according to claim 2, wherein the pressure chamber formation member further has a metallic film formed of the same material as the first electrodes to expand in the first direction and in the second direction, the metallic film being positioned between the insulation film and the first surface of the piezoelectric layer;
the first through hole is positioned between the metallic film and the first ends in the second direction, and
first contact points between the first traces and the wiring member and a second contact point between the second electrode and the wiring member overlap with the metallic film in the third direction.

5. The liquid jetting apparatus according to claim 2, wherein the pressure chamber formation member further has:
   second pressure chambers arranged in the first direction, the second pressure chambers being covered by the insulation film and different from the first pressure chambers;
   third electrodes overlapping respectively with the second pressure chambers in the third direction while sandwiching the insulation film therebetween; and
   third traces connected respectively with the third electrodes,
the second electrode overlaps with the third electrodes in the third direction while sandwiching the piezoelectric layer therebetween,
the second pressure chambers have third ends aligned in the first direction, and fourth ends aligned in the first direction,
the third ends are positioned between the fourth ends and the first ends in relation to the second direction, and
first contact points between the first traces and the wiring member, second contact point between the second trace and the wiring member, and third contact points between the third traces and the wiring member are positioned between the first ends and the third ends in relation to the second direction.

6. The liquid jetting apparatus according to claim 2, wherein the pressure chamber formation member further has:
   second pressure chambers arranged in the first direction, the second pressure chambers being covered by the insulation film and different from the first pressure chambers;
   third electrodes overlapping respectively with the second pressure chambers in the third direction while sandwiching the insulation film therebetween;
   a fourth electrode overlapping with the third electrodes in the third direction while sandwiching the piezoelectric layer therebetween;
   third traces connected respectively with the third electrodes; and
   a fourth trace connected with the fourth electrode,
the second pressure chambers have third ends aligned in the first direction, and fourth ends aligned in the first direction,
the third ends are positioned between the fourth ends and the first ends in relation to the second direction, and
first contact points between the first traces and the wiring member, second contact point between the second trace and the wiring member, third contact points between the third traces and the wiring member, and a fourth contact point between the fourth trace and the wiring member are positioned between the first ends and the third ends in relation to the second direction.

7. The liquid jetting apparatus according to claim 1, wherein a first through hole is formed in the piezoelectric layer to extend in the first direction, the first through hole being formed on a side opposite to the second ends in the second direction with respect to the first ends, the piezoelectric layer has a first inner surface and a second inner surface being formed by the first through hole and extending respectively in the first direction, the first inner surface is positioned between the second inner surface and the first ends in relation to the second direction, and the bonding surface of the first convex portion to the pressure chamber formation member has both ends in the second direction, the both ends in the second direction being positioned on a side opposite to the first ends in the second direction with respect to a second angular portion of the piezoelectric layer, the second angular portion being formed by the second surface and the second inner surface of the piezoelectric layer.

8. The liquid jetting apparatus according to claim 1, wherein a first through hole is formed in the piezoelectric layer to extend in the first direction, the first through hole being formed on a side opposite to the second ends in the second direction with respect to the first ends, the piezoelectric layer has a first inner surface and a second inner surface being formed by the first through hole and extending respectively in the first direction, the first inner surface is positioned between the second inner surface and the first ends in relation to the second direction, the piezoelectric layer has a first angular portion and a second angular portion, the first angular portion being formed by the second surface and the first inner surface, the second angular portion being formed by the second surface and the second inner surface, and the first angular portion and the second angular portion are positioned between both ends of the first convex portion in the second direction, in relation to the second direction.

9. The liquid jetting apparatus according to claim 1, wherein the piezoelectric layer has a first lateral surface and a second lateral surface extending respectively in the first direction, the first lateral surface being positioned on a side opposite to the second ends in the second direction, with respect to the first ends, the second lateral surface being positioned on a side opposite side to the first lateral surface in the second direction, with respect to the second ends, a second piezoelectric layer is further laid on the insulation film on a side opposite to the second lateral surface in the second direction, with respect to the first lateral surface, the second piezoelectric layer has:
a third surface facing the insulation film;
a fourth surface on a side opposite to the insulation film, with respect to the third surface; and
a third lateral surface and a fourth lateral surface separated from each other in the second direction, the fourth lateral surface is positioned on a side opposite to the first lateral surface of the piezoelectric layer in the second direction, with respect to the third lateral surface, and the bonding surface of the first convex portion to the pressure chamber formation member has both ends in the second direction, the both ends in the second direction being positioned between the first ends and a first angular portion of the piezoelectric layer in the second direction, the first angular portion being formed by the second surface and the first lateral surface of the piezoelectric layer.

10. The liquid jetting apparatus according to claim 1, wherein the piezoelectric layer has a first lateral surface and a second lateral surface extending respectively in the first direction, the first lateral surface being positioned on a side opposite to the second ends in the second direction, with respect to the first ends, the second lateral surface being positioned on a side opposite to the first lateral surface in the second direction, with respect to the second ends, a second piezoelectric layer is further laid on the insulation film on a side opposite to the second lateral surface in the second direction, with respect to the first lateral surface, the second piezoelectric layer has:
a third surface facing the insulation film;
a fourth surface on a side opposite to the insulation film, with respect to the third surface; and
a third lateral surface and a fourth lateral surface separated from each other in the second direction, the fourth lateral surface is positioned on a side opposite to the first lateral surface of the piezoelectric layer in the second direction, with respect to the third lateral surface, and the bonding surface of the first convex portion to the pressure chamber formation member has both ends in the second direction, the both ends in the second direction being positioned on a side opposite to the first lateral surface of the piezoelectric layer in the second direction, with respect to a second angular portion of the second piezoelectric layer, the second angular portion being formed by the fourth surface and the third lateral surface of the second piezoelectric layer.

11. The liquid jetting apparatus according to claim 1, wherein the piezoelectric layer has a first lateral surface and a second lateral surface extending respectively in the first direction, the first lateral surface being positioned on a side opposite to the second ends in the second direction, with respect to the first ends, the second lateral surface being positioned on a side opposite to the first lateral surface in the second direction, with respect to the second ends, a second piezoelectric layer is further laid on the insulation film on a side opposite to the second lateral surface in the second direction, with respect to the first lateral surface, the second piezoelectric layer has:
a third surface facing the insulation film;
a fourth surface on a side opposite to the insulation film, with respect to the third surface; and
a third lateral surface and a fourth lateral surface separated from each other in the second direction, the fourth lateral surface is positioned on a side opposite to the first lateral surface of the piezoelectric layer in the second direction, with respect to the third lateral surface, the piezoelectric layer has a first angular portion formed by the second surface and the first lateral surface, the second piezoelectric layer has a second angular portion formed by the fourth surface and the third lateral surface, and the first angular portion and the second angular portion are positioned between both ends of the first convex portion in the second direction, in relation to the second direction.

* * * * *